United States Patent
Ding et al.

(10) Patent No.: US 8,215,176 B2
(45) Date of Patent: Jul. 10, 2012

(54) PRESSURE SENSOR FOR HARSH MEDIA SENSING AND FLEXIBLE PACKAGING

(75) Inventors: Xiaoyi Ding, Lake Zurich, IL (US); Jeffrey J. Frye, Grayslake, IL (US); Jen-Huang Albert Chiou, Libertyville, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 548 days.

(21) Appl. No.: 12/473,176

(22) Filed: May 27, 2009

(65) Prior Publication Data

US 2010/0300207 A1    Dec. 2, 2010

(51) Int. Cl.
*G01L 9/06* (2006.01)

(52) U.S. Cl. .......... 73/721; 73/715; 73/753; 361/283.4

(58) Field of Classification Search ............. None
See application file for complete search history.

(56) References Cited

U.S. PATENT DOCUMENTS

| | | | | |
|---|---|---|---|---|
| 4,399,707 A | * | 8/1983 | Wamstad | 73/727 |
| 4,502,335 A | * | 3/1985 | Wamstad et al. | 73/721 |
| 4,665,754 A | * | 5/1987 | Glenn et al. | 73/727 |
| 4,763,098 A | * | 8/1988 | Glenn et al. | 338/4 |
| 5,142,912 A | * | 9/1992 | Frische | 73/702 |
| 5,259,247 A | * | 11/1993 | Bantien | 73/718 |
| 5,684,253 A | * | 11/1997 | Bonne et al. | 73/706 |
| 5,987,921 A | * | 11/1999 | Ueyanagi | 65/40 |
| 6,255,728 B1 | * | 7/2001 | Nasiri et al. | 257/704 |
| 6,608,370 B1 | | 8/2003 | Chen | |
| 6,878,608 B2 | * | 4/2005 | Brofman et al. | 438/459 |
| 7,401,525 B2 | * | 7/2008 | Cobianu et al. | 73/754 |
| 7,518,234 B1 | * | 4/2009 | Okojie | 257/710 |
| 7,518,493 B2 | * | 4/2009 | Bryzek et al. | 340/442 |
| 7,644,625 B2 | * | 1/2010 | Ricks | 73/756 |
| 7,726,197 B2 | * | 6/2010 | Selvan et al. | 73/777 |
| 7,775,119 B1 | | 8/2010 | Suminto et al. | |

* cited by examiner

*Primary Examiner* — Lisa Caputo
*Assistant Examiner* — Jermaine Jenkins

(57) ABSTRACT

MEMS pressure sensing elements, the fabrication methods of the sensing elements, and the packaging methods using the new sensing elements are introduced to provide a way for a harsh media absolute pressure sensing and eliminating the negative effects caused by the gel used in the prior art. The invention uses vertical conductive vias to electrically connect the enclosed circuit to the outside, and uses a fusion bond method to attach a cap with the embedded conductive vias over a device die having a circuit for example a piezoresistive Wheatstone bridge to sense pressure. New packaging methods comprise a) a two-pocket housing structure and using a surface mounting method to attach a new sensing element into one pocket by a ball grid array (BGA), and b) a single pocket structure and using conventional die attach and wire bonding. Both methods can be used for harsh media pressure sensing but without the negative effects caused by the gel in prior art.

23 Claims, 11 Drawing Sheets

PRESSURE SENSOR FOR HARSH MEDIA SENSING AND FLEXIBLE PACKAGING

Many silicon based micro sensors use so-called MEMS (Microelectromechanical Systems) technology to achieve low cost and high performance. One such a device is a MEMS pressure sensor, which is comprised of a small, thin silicon diaphragm onto which a piezoresistive circuit, normally a Wheatstone bridge is formed. Diaphragm deflections caused by pressure applied to the diaphragm change the resistance values of the piezoresistors in the bridge circuit. An electronic circuit detects the resistance changes of the piezoresistive bridge and outputs an electrical signal representative of the applied pressure.

FIG. 1 is a perspective view of a packaged pressure sensor and FIG. 2 is a cross-section of the pressure sensor shown in FIG. 1. The pressure sensor is comprised of a housing 2 that encloses a MEMS pressure sensing element 6 and an electronic circuit 7. Fluid pressure including gases and liquids is applied through the pressure port 4 to the sensing element 6, which is electrically connected with an electronic circuit 7. Lead frame electrodes 10 provide a means for electrical connections to be made with the electronic circuit 7 and the sensing element 6.

As can be seen in FIG. 2, the electronic circuit 7, MEMS pressure sensing element 6, wires and wire bonds, are located in a pocket 9 of the housing 2. A gel 8 fills the pocket 9 in the housing 2 and covers the electronic circuit 7, MEMS pressure sensing element 6, wires and wire bonds. The MEMS sensing element 6 includes a piezoresistive bridge. The resistances of the piezoresistors in the bridge change with the applied pressure through the port 4, and circuit 7 detects the resistance changes of the piezoresistive bridge and outputs an electrical signal through the lead frame 10 responding to the applied pressure signal. The gel 8 protects the MEMS sensing element 6, wires that extend from the sensing element 6 to the circuit 7, from mechanical vibration and from moisture in the fluid (liquid or gas) that can build up the die (both IC and element) surfaces.

The sensing element 6 shown in FIG. 2 is a so called absolute pressure sensing element. As can be seen in the enlarged view of the sensing element 6 provided in FIG. 3, the sensing element 6 is comprised of a silicon die 201 formed with a thin diaphragm 203 on which a piezoresistive bridge is built.

The absolute pressure sensor as shown in FIGS. 1-3 works well for many applications, however, corrosive gases and liquids that are commonly found in automotive exhaust gases or in other "harsh media" can degrade the conventional gel. When used to sense harsh media, the gel eventually deteriorates and fails to protect the lead wires 206 and bond pads 205 from reacting with the harsh media. The pressure sensor itself eventually fails.

Another problem with gel used in prior art pressure sensors shown in FIG. 1 and FIG. 2 arises when the sensor is subjected to certain types of mechanical vibrations. The gel is bulky and massive. When the gel is located on top of the thin silicon diaphragm, vibration of the gel transmits the vibration of a large mass to the diaphragm which in turn subjects the thin diaphragm to large acceleration forces. If the gel is caused to vibrate with a high acceleration and/or at a high frequency, the gel vibration can damage the diaphragm 203. High frequency, high-acceleration vibration occurs when the cover 3 is ultrasonically welded to the housing 2. While ultrasonic welding is fast and provides a highly reliable hermetic seal, the high-frequency vibrations that it requires generates correspondingly high frequency vibrations, which tend to damage the MEMS device 6 when the vibrations are transmitted to the MEMS device through the gel 8. In addition to increasing the likelihood of damage to the MEMS device, data also shows that the gel 8 tends to dampen the responsiveness of the MEMS pressure sensor device because the gel 8 is viscous. A need therefore exists for an absolute pressure sensor that eliminates the gel from at least the top of the diaphragm, is able to sense a pressure with harsh media, and enables a safe use of the ultrasonic welding process without causing any damage to the diaphragm.

DETAILED DESCRIPTION

In this detailed description of the invention, the structures and the methods of making the new sensing elements are introduced first, and then followed by the description of the methods for packaging the new sensing elements to resolve the application issues mentioned in above.

Figure 1:
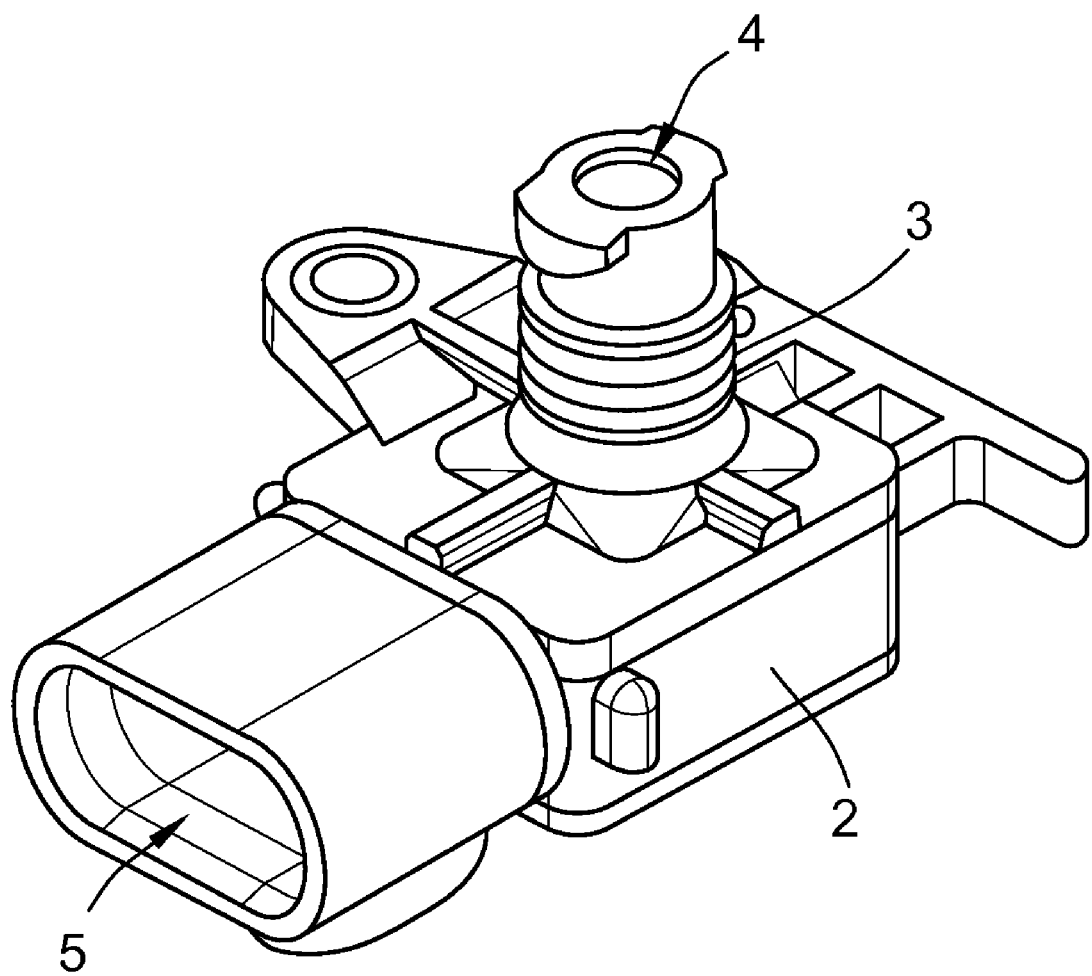
FIG. 1 is a perspective view of a prior art absolute pressure sensor.
Figure 2:
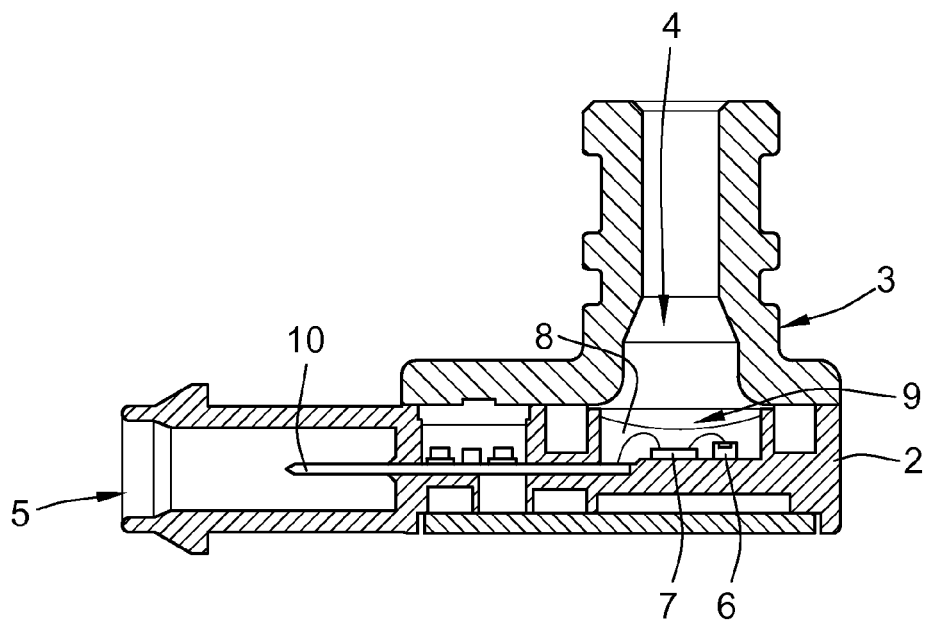
FIG. 2 is a cross-section of the sensor shown in FIG. 1.
Figure 3:
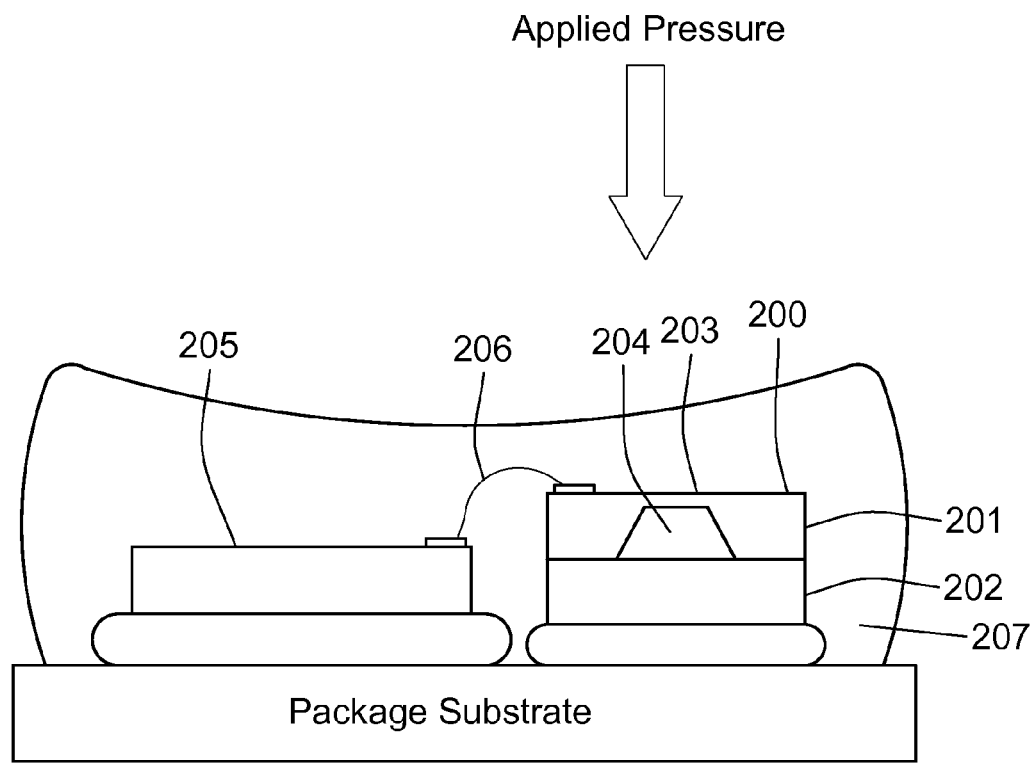
FIG. 3 is a cross-section of a prior art for an absolute pressure sensor assembly.
Figure 4:
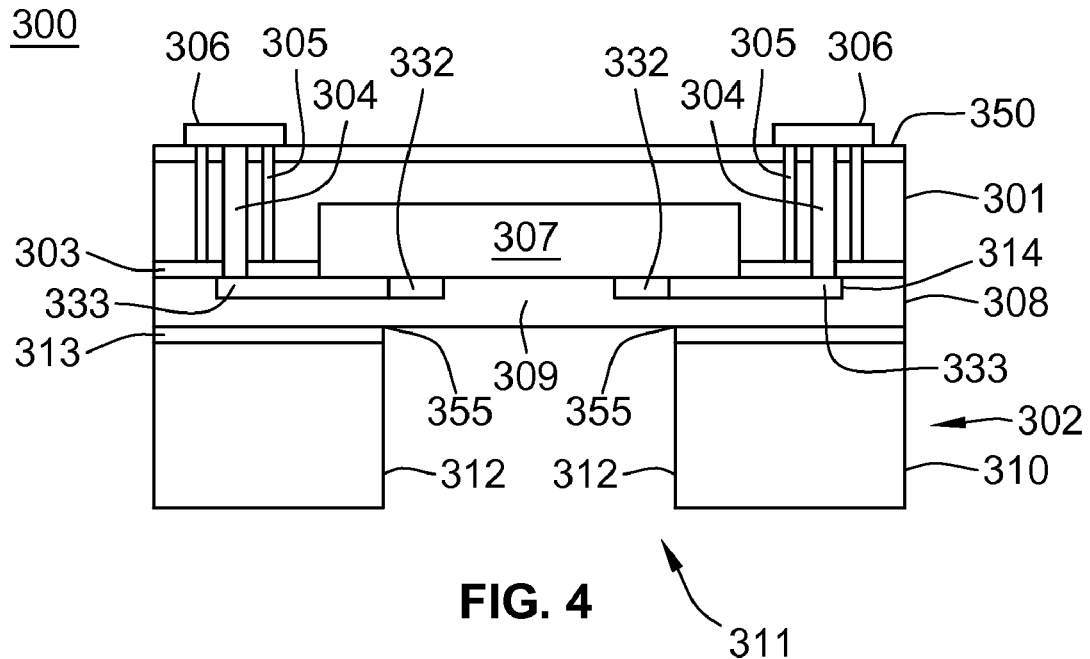
FIG. 4-FIG. 7 show cross-sections of the new absolute pressure sensing elements in four embodiments.

FIG. 4 shows a cross-section of a preferred embodiment of a sensing element 300, comprising two silicon die: a silicon cap or a cap 301 on the top and a device die or a silicon die 302 on the bottom. The cap 301 is embedded with conductive vias 304 insulated from each other by a dielectric-filled cylindrical ring 305 surrounding each via 304. The bottom side of the cap 301 has a recess 307 formed into it. The top side of the cap 301 is covered with a dielectric passivation layer 350 over which there are metal bond pads 306 electrically connected with the respective conductive vias 304 through the contact windows opened in the passivation layer 350.

The silicon die 302 is comprised of two silicon layers: a thin, upper silicon layer 308 where the diaphragm 309 with edges 355 is formed, and a lower, thick silicon layer 310 where a cavity 311 having a substantially vertical wall 312 is formed. The cavity 311 is formed to be located under the diaphragm 309. The two silicon layers 308 and 310 are attached to each other through an oxide layer 313. The diaphragm 309 is embedded with a piezoresistive bridge circuit 314 on the top side of the diaphragm 309, which is the side opposite the cavity 311. The piezoresistive bridge circuit 314 on the diaphragm 309 comprises electrical components 332 that include silicon piezoresistors as well as conductive silicon interconnects 333.

The cap 301 is hermetically sealed to the silicon die 302 through a thin silicon oxide layer 303 in such a way that the recess 307 in the cap 301 encloses an open volume in the cap 301. The dimensions of the recess 307 are such that the vertical walls of the recess 307 are located beyond the diaphragm edge 355 but inside the conductive vias 304, which electrically connect interconnects 333 of the circuit 314 through the contact windows opened in the thin oxide layer 303. The pressure inside the enclosed recess 307 is preferably a vacuum, or at least in a partial vacuum so that diaphragm deflections are caused by a pressure to be measured. Such an embodiment is referred to as an absolute pressure sensor. In an alternate embodiment, the cap is formed or provided with a through-hole (not shown) that leads into the recess 307, which enables the sensor to function as a differential pressure sensor.

Figure 5:
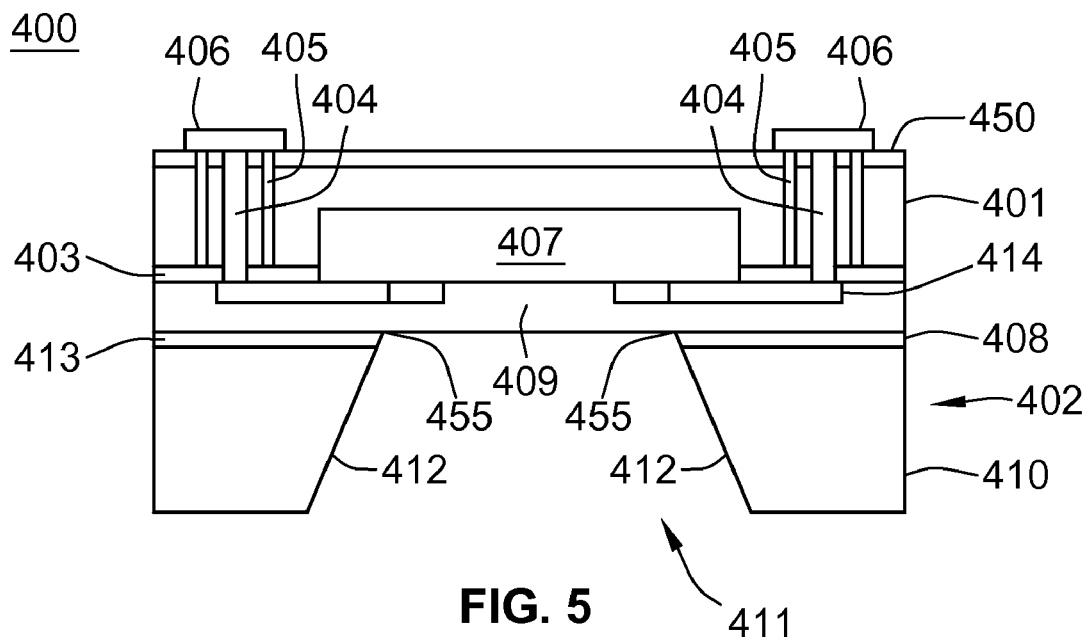

FIG. 5 shows a cross-section of a second embodiment of a sensing element 400. The sensing element 400 shown in FIG. 5 differs from the sensing element 300 shown in FIG. 4 in that the cavity 411 shown in FIG. 5 is depicted as having a slopped wall 412. In FIG. 4, the cavity 311 has a substantially vertical wall 312.

Figure 6:
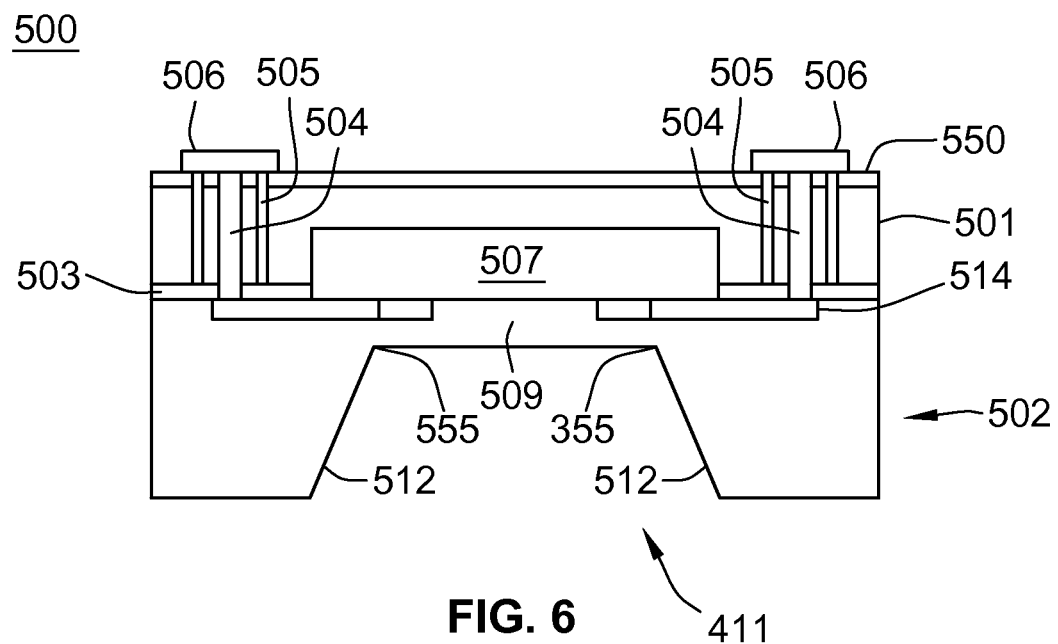

FIG. 6 shows a cross-section of a third embodiment of a sensing element 500. The sensing element 500 shown in FIG. 6 differs from the sensing element shown in FIG. 4 in that the cavity 411 in FIG. 6 has a sloped wall. In addition to having a sloped-wall cavity 411, the silicon die 502 in FIG. 6 has only one silicon layer.

Figure 7:
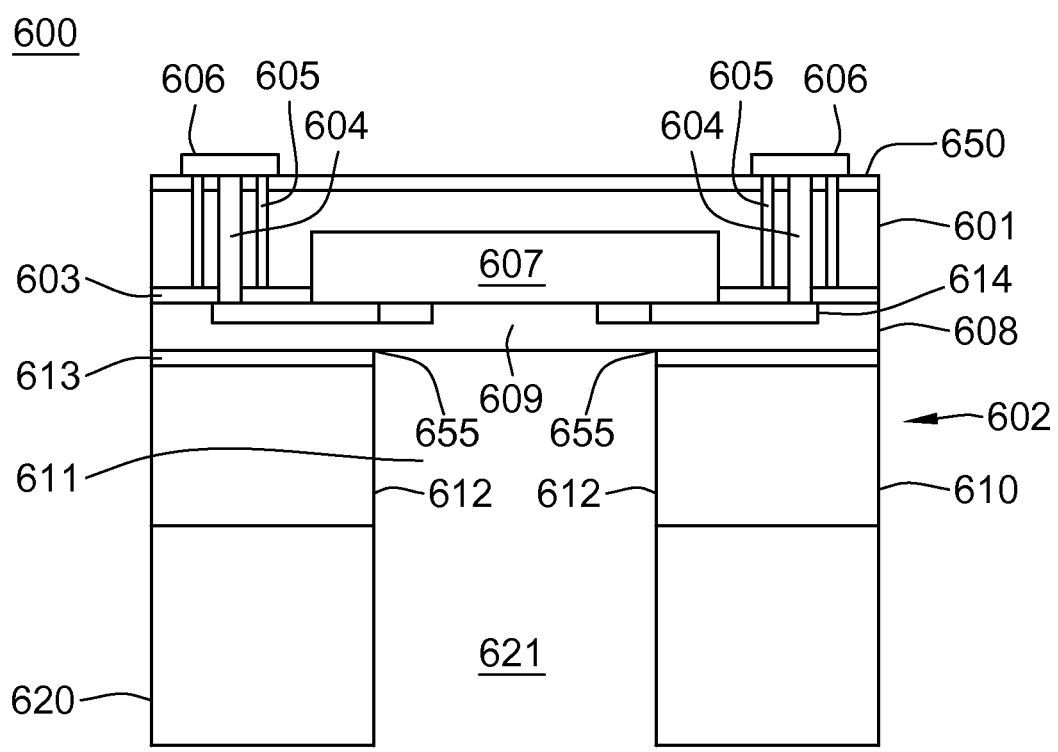

FIG. 7 shows a cross-section of a forth embodiment of a sensing element 600. In FIG. 7, the sensing element 600 has an extra pedestal 620 with a coincident hole 621 aligned to the cavity 611 formed in the silicon die 602. The pedestal 620 is attached to the cavity side of the element that is comprised of a cap 601 and a silicon die 602. In some applications, such a pedestal 620 with a hole 621 can minimize the effects of the packaging stresses on the sensing element. It should be mentioned too, that the second pedestal 620 with a hole 621 depicted in FIG. 7 can be optionally provided to each of the embodiments shown in FIGS. 4-6.

It should be noted that each circuit on the sensing element shown in FIGS. 4-7 has more than one electrode or interconnect that is connected to a metal bond pad through a conductive via. For simplicity, however, the drawings show only two metal bond pads on top of conductive vias located on two sides of the die. It should be mentioned too that the structures shown in the figures permit the bond pads to be located at various different locations. In a preferred embodiment, the top surface of the cap die is covered with a dielectric passivation layer, which is identified in FIG. 4 by reference numeral 350, in FIG. 5 by reference numeral 450, in FIG. 6 by reference numeral 550, and in FIG. 7 by reference numeral 650. The dielectric passivation layer(s) is/are comprised of silicon oxide and/or silicon nitride. The metal bond pads can be located anywhere on top of the passivation layer on the top side of the cap die.

Metal interconnect lines (not shown in the drawings) can be formed on top of the passivation layer to electrically connect the bond pads with associated conductive vias through the contact windows opened in the passivation layer 350, 450, 550 or 650 as shown in FIGS. 4-7. The metal bond pads can be located in different spots on top of the passivation layer on the cap die based on the special packaging demand, such as on the corners, or in one side of the die, or in two sides of the die, etc.

Figure 8:
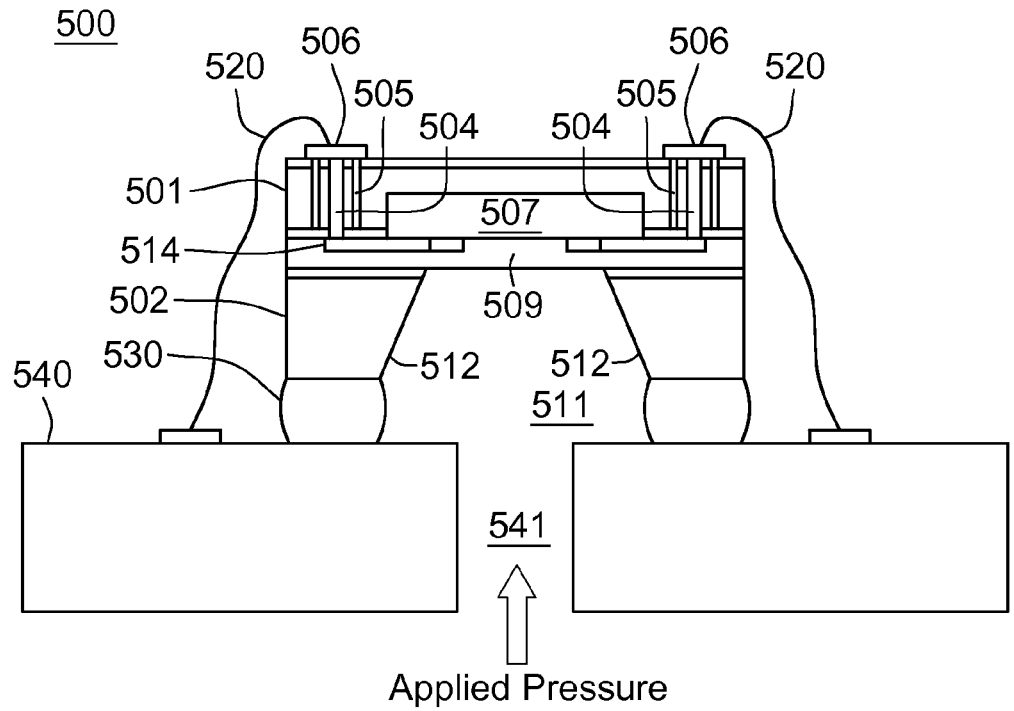
FIG. 8-FIG. 9 show the flexible packaging approaches using the new absolute pressure sensing elements, a conventional wire bonding approach in FIG. 8 and a flip-chip surface mounting die attach in FIG. 9.

FIG. 8 shows a packaging structure for a sensing element identified by reference numeral 500, the sensing element 500 being an exemplar of the one depicted in FIG. 6, but also representative of the sensing elements 300, 400 and 600 depicted in FIGS. 4, 5 and 7 respectively.

In FIG. 8, the sensing element 500 is attached to a package substrate 540 having a hole 541 aligned with the cavity 511 of the element 500. The sensing element is attached to the substrate using a silicone mounting adhesive 530. Wire bonding 520 is used to electrically connect the bond pads 506 to metal pads on the package substrate 540, or to an integrated circuit (IC) die (not shown), or to a printed circuit board or PCB (not shown).

Since wire bonding is used to electrically connect the sensing element 500 to other electronic circuits, the aforementioned gel (not shown) is applied over the wire bond although the gel is not shown in FIG. 8. As the sensing element is configured in FIG. 8, i.e., with the working fluid applied to the diaphragm 509 through the hole 541, the gel does not contact the diaphragm. Constructing the sensing element as described above and packaging it as shown in FIG. 8 avoids the problems that exist with prior art sensing elements having the wire bonds and diaphragms covered with gel.

The packaging shown in FIG. 8 is also compatible for use with harsh working fluid or media because the top surface of the circuit 514 having piezoresistive devices is sealed inside the recess 507. Materials compatible with harsh media are used for the die mounting layer 530, the diaphragm 509 and the cavity wall 512. When a gel is needed to cover the wires and the top side of the element, it will not interfere with diaphragm vibration because the gel is not applied directly to the diaphragm 509.

Figure 9:
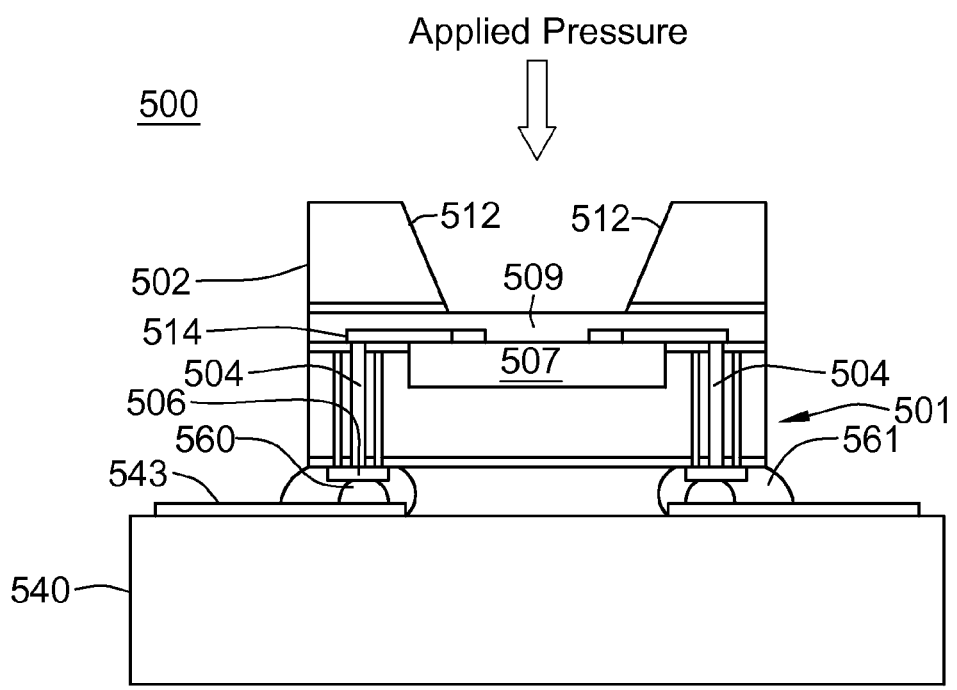

FIG. 9 shows another way to package a sensing element in which the sensing element 500 is attached to a package substrate 540 using a ball grid array (BGA) 560. In this method, the BGA 560 is comprised of materials such as gold (Au) and tin (Sn), which are used to physically attach the sensing element 500 to the substrate 540 and to electrically connect metal bond pads 506 on the sensing element to metal pads 543 on the package substrate 540. An under fill material 561 is used to protect the BGA 560 from reacting with harsh media that the sensing element 500 might be exposed to. In FIG. 9, no wire bonding or gel are needed to electrically connect the piezoresistive circuit elements to other external electronic devices. Gel related issues that exist with prior art methods and structures are therefore eliminated.

As with the method and structure shown in FIG. 8, the method and structure shown in FIG. 9 is usable with harsh media because the top surface of the circuit 514 having the piezoresistive circuit elements is sealed inside the recess 507. Materials that are exposed to harsh media include the underfill layer 561 and the silicon backside of the diaphragm 509 and the cavity wall 512 but those materials are selected to be harsh-media resistant.

Having described the new sensing element structures above, the methods of making the devices are described below. Since the structures shown in FIGS. 4-7 are the same except for the device die the process steps for making the devices are the same for both device die structures. The method described below depicts the method using a SOI wafer in the drawings for simplicity.

FIGS. 10-21 show the steps to construct one sensing element structure, however, the process steps depicted in the figures and described below can be used to simultaneously fabricate hundreds or thousands of sensing elements depending on the designed die size and size of the wafer from which the die are obtained. The described method of making the new elements therefore includes a wafer-level fabrication method.

Figure 10:
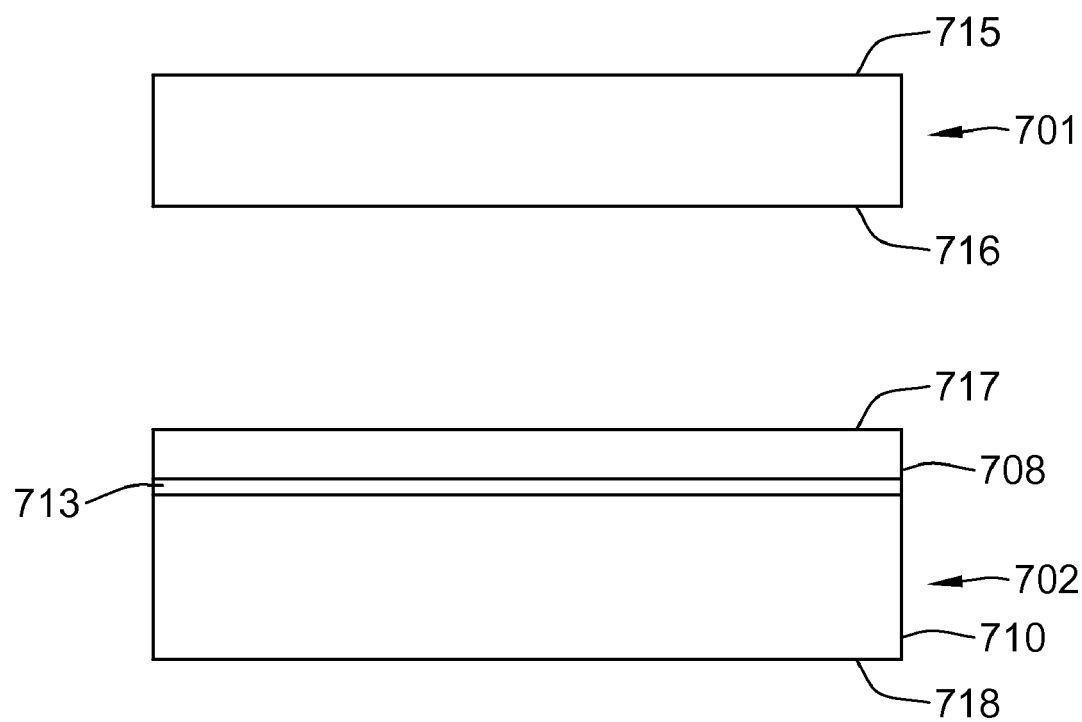
FIG. 10-FIG. 16 shown the major process steps for making the new absolute sensing elements.

Referring to FIG. 10, the fabrication process starts with two separate silicon wafers. The top wafer 701 is a simple silicon wafer, referred to as a cap wafer 701. It has a top side 715 and a bottom side 716.

The bottom wafer 702 is preferably a SOI wafer, and is referred to as the device wafer 702. As with the top wafer 702, the device wafer 702 has its own top side 717 and a bottom side 718.

The device wafer 702 has two separate silicon layers one is a thin device layer 708 having its top surface as the top side 717 of the device wafer 702. The other layer is a relatively thick carrier layer 710, with its bottom surface being the bottom side 718 of the device wafer 702. The thin device layer 708 is used to fabricate circuits such as piezoresistive Wheatstone bridges. There is a buried oxide (BOX) layer 713 between thin device layer 708 and the carrier layer 710. The thickness of the BOX layer is typically between about 0.5 to about 3 microns. In an alternative embodiment, the device wafer 702 can also be a simple silicon wafer. The SOI wafer is preferred however, because it enables using an etch stop in a diaphragm-forming step, and also enables a nearly vertical sidewall in the cavity under the diaphragm, one benefit of which is minimized die size.

Figure 11:
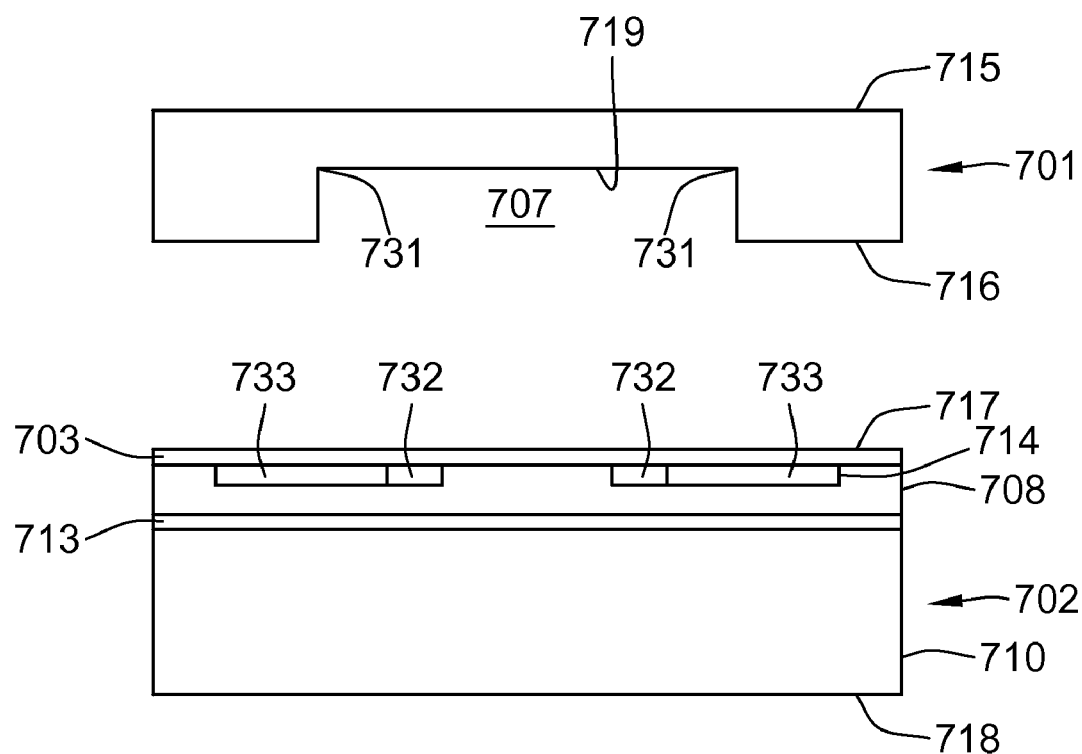

In FIG. 11, a first step of the method is to form a recess 707 into the bottom side 716 of the cap wafer 701. The depth of the recess 707 is preferably between about 5 microns to about 20 microns. When the recess 707 is formed, it has its own bottom surface 719, which is preferably formed to be planar or substantially planar. The intersection of the horizontal bottom surface 719 of the recess 707 with the side walls 730 formed during the etching process defines an outer perimeter 731 of the recess 707.

Figure 12:
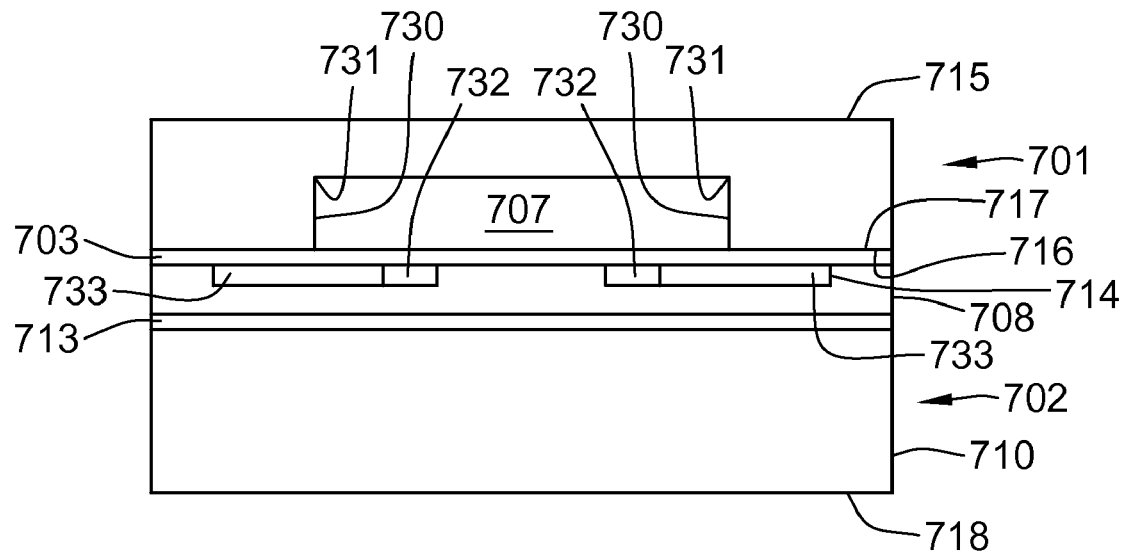

Separate and apart from the process used to form the recess 707, the device wafer 702 is processed to form a circuit 714 such as the aforementioned piezoresistive bridge, on the top surface 717 of the device wafer 702 as shown in FIG. 11. The circuit 714 comprises components 732 such as the silicon piezoresistors, and conductive silicon interconnects 733. The silicon conductive interconnects 733 are used to electrically connect the piezoresistive components 732 to each other and form a useful circuit 714 such as a Wheatstone bridge, which is a circuit well-known to those of ordinary skill in the electronic arts. Upon completion of fabricating the circuit 714, the top surface 717 of the device wafer 702 is covered with a thin oxide layer. FIG. 12 shows that after the recess 707 is formed on the cap wafer 701 and after a circuit 714 is formed on the device wafer 702, the two wafers 701 and 702 are attached to each other using fusion bonding, which is a technique well known to those of ordinary skill in MEMS technology. The details of form a fusion bond are therefore omitted for brevity.

The fusion bond joins the bottom surface 716 of the cap wafer 701 and the top surface 717 of the device wafer 702 together through an oxide layer 703. As can be seen in FIG. 12, the cavity 707 is large enough to enclose all the components 732 and silicon interconnects 733. The cap wafer 701 thus encloses and protects the circuit 714.

Figure 13:
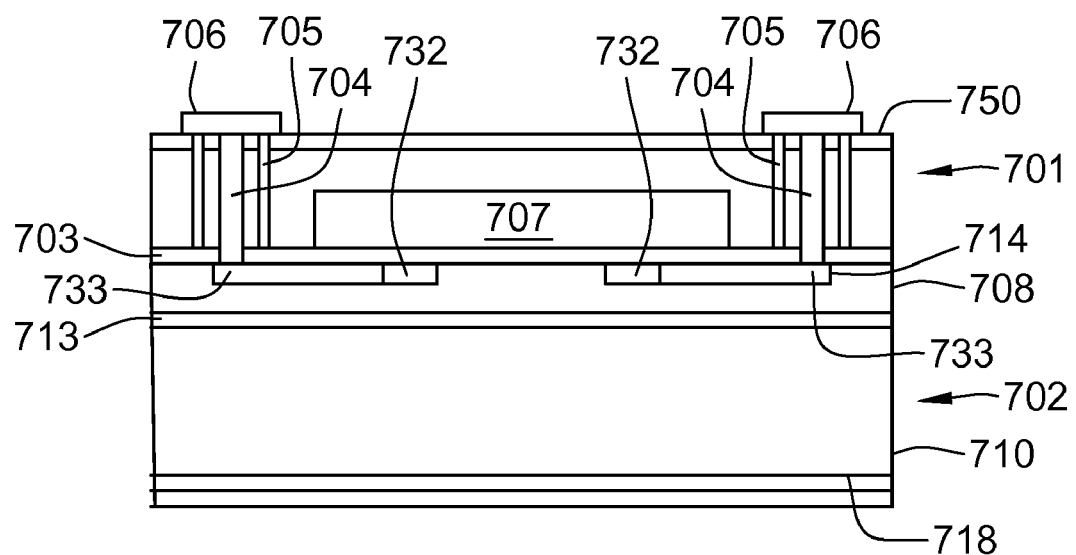

FIG. 13 also shows the cross-section of the wafers when the conductive vias 704 and metal bond pads 706 are formed in such a way that the bottom ends of the vias 704 are electrically contacted with the respective conductive silicon interconnects 733 of the circuit 714. The top ends of the vias 704 are electrically connected to the metal bond pads 706 formed on top of a passivation layer 750 deposited on the top side 715 of the cap wafer 701.

The vias 704 are formed in steps. First, a deep reactive ion etch (DRIE) is performed to form a hollow cylindrical ring 705 surround an area where a conductive via 704 will be formed later. The ring 705 is formed beginning from the top side 715 and ends at the oxide layer 703.

After the hollow cylindrical rings 705 are formed, the next step is to fill the rings 705 with dielectric materials such as silicon oxide and/or silicon nitride so that each silicon island surrounded by the ring 705 is electrically isolated from the rest of the cap wafer 701. The third step is to polish the top surface 715 of the cap wafer 705.

Using DRIE again, a hole is etched inside each silicon island that is surrounded by the isolation ring 705. The holes etched inside each silicon island starts from the top surface 715 of the cap wafer 715 and ends at the top surface of the silicon conductive interconnects 733 of the circuit 714.

A forth step of forming the conductive vias is to fill the etched holes with conductive material, such as aluminum or conductive poly-silicon. The conductive material added to the etched holes form the conductive vias 704.

A fifth step is to polish the top surface of the cap wafer and deposit a passivation layer such as silicon oxide and/or silicon nitride on the top surface 715 of the cap wafer 701. The last step, which is also visible in FIG. 13, is to open contact windows through the passivation layer 750 and form metal bond pads 706 on top of the passivation layer 750 and over the conductive vias 704 in such a way that each metal bond pad 706 is electrically connected to a respective conductive via 704.

In an alternative embodiment, the conductive via can be provided by forming a through-hole through the wafer and coating the sidewall of the through-hole with an oxide. After the oxide is formed, the remaining open volume of the through-hole can be filled with a conductive material.

As previously mentioned, in an alternative embodiment, the device wafer 702 can be a simple silicon wafer. The process steps for forming the device wafer 702 that are described above are also performed on a SOI wafer.

Figure 14:
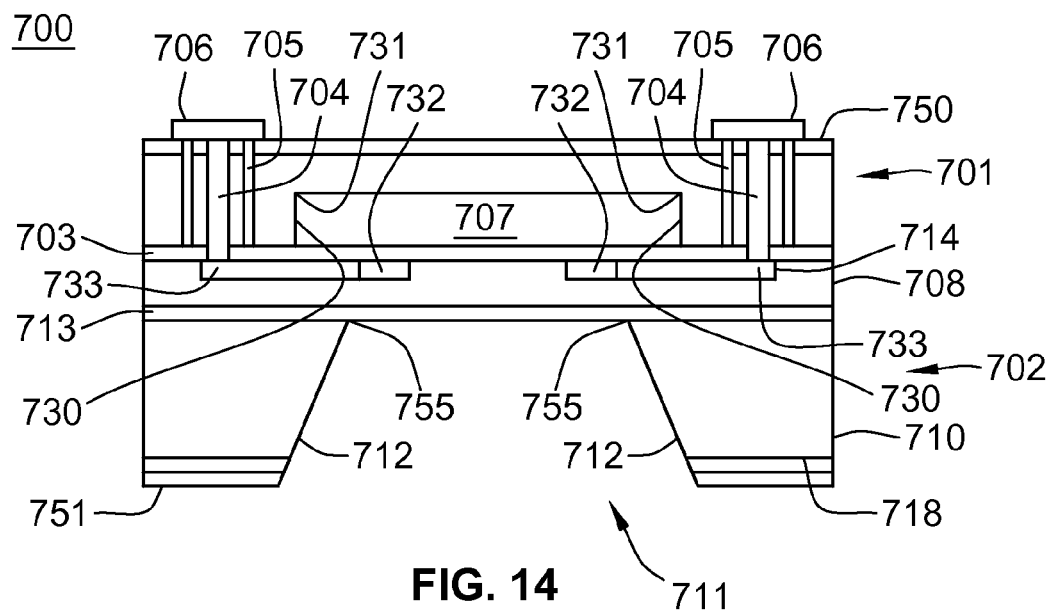
Figure 15:
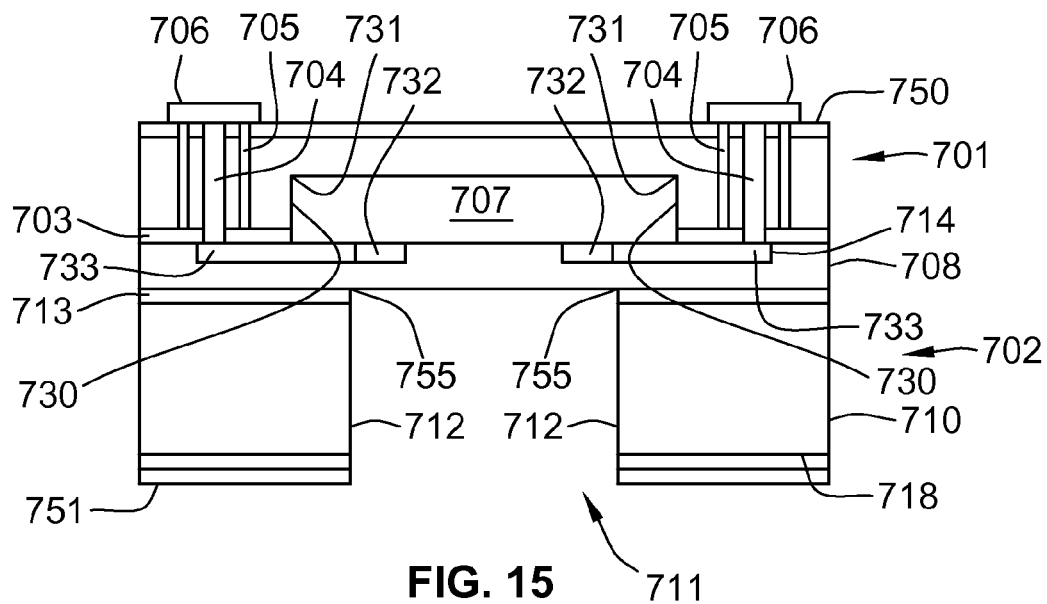

Referring now to FIGS. 14-15, the next step of the fabrication process is to selectively etch a cavity into the bottom side 718 of the device wafer 702 in order to form a diaphragm 709 in such a way that the components 732 of the circuit 714 are located on the top side of the diaphragm 709 and close to the diaphragm edges 755. To accomplish the selective etching in FIGS. 14 and 15, a mask layer 751 is applied to the bottom surface 718 to protect area that is not to be etched and to open or expose areas of the bottom side 718 of the device wafer 702 that are to be etched away. The mask layer 751 preferably comprises silicon oxide, silicon nitride and a photoresist.

At least two different anisotropic etching techniques can be used to etch away the silicon to form the hole 711. The hole 711 can be formed using a wet etch with potassium hydroxide (KOH) or a dry etch, such as deep reactive ion etch (DRIE). Since both techniques are well known to those of ordinary skill in the art, details of their procedures are omitted for brevity.

FIG. 14 shows a cross-section of the wafer with a cavity 711 formed by using a wet etch method. The sloped wall 712 is a well-known characteristic of wet etching silicon using an etchant like KOH. As shown in FIG. 14, the wall angle is about 54° relative to the horizontal bottom surface 718 when the device wafer 702 is a (100)-oriented silicon wafer.

Those of ordinary skill will appreciate the wet etching rate of silicon oxide is much less than the etching rate of silicon. Therefore, when the etch front reaches to the BOX layer 713, the etching process is essentially stopped due to a very slow etch rate of silicon oxide. Because the BOX layer 713 effectively stops the etching process, upon completion of the silicon etch, a silicon diaphragm 709 with its thickness and uniformity same as the ones of the thin device layer 708, is obtained.

As previously mentioned, the device wafer can also be a simple one layer silicon wafer, as shown in FIG. 6. In such an embodiment, the thickness and uniformity of the diaphragm 509 is mainly controlled by the etch time, which normally ends up with a large thickness and uniformity variation from die-to-die within a wafer and from wafer-to-wafer within a wafer lot.

FIG. 15 shows a cross-section of the wafers with a cavity 711 formed by using a dry etch method, such as DRIE. It is well known to those of ordinary skill in the semiconductor fabrication art that DRIE results in a substantially vertical wall 712 with an angle close to 90° from the bottom surface 718 of the device wafer 702. Another feature of the silicon etch using DRIE is that the etch rate for silicon oxide is much slower than that for silicon. Therefore, when the etch front reaches to the BOX layer 713, the etch is virtually stopped due to a very slow etch rate of silicon oxide. Due to this feature, upon completion of the silicon etch, a silicon diaphragm 709 with its thickness and uniformity same as the ones of the thin device layer 708 is obtained.

Figure 16:
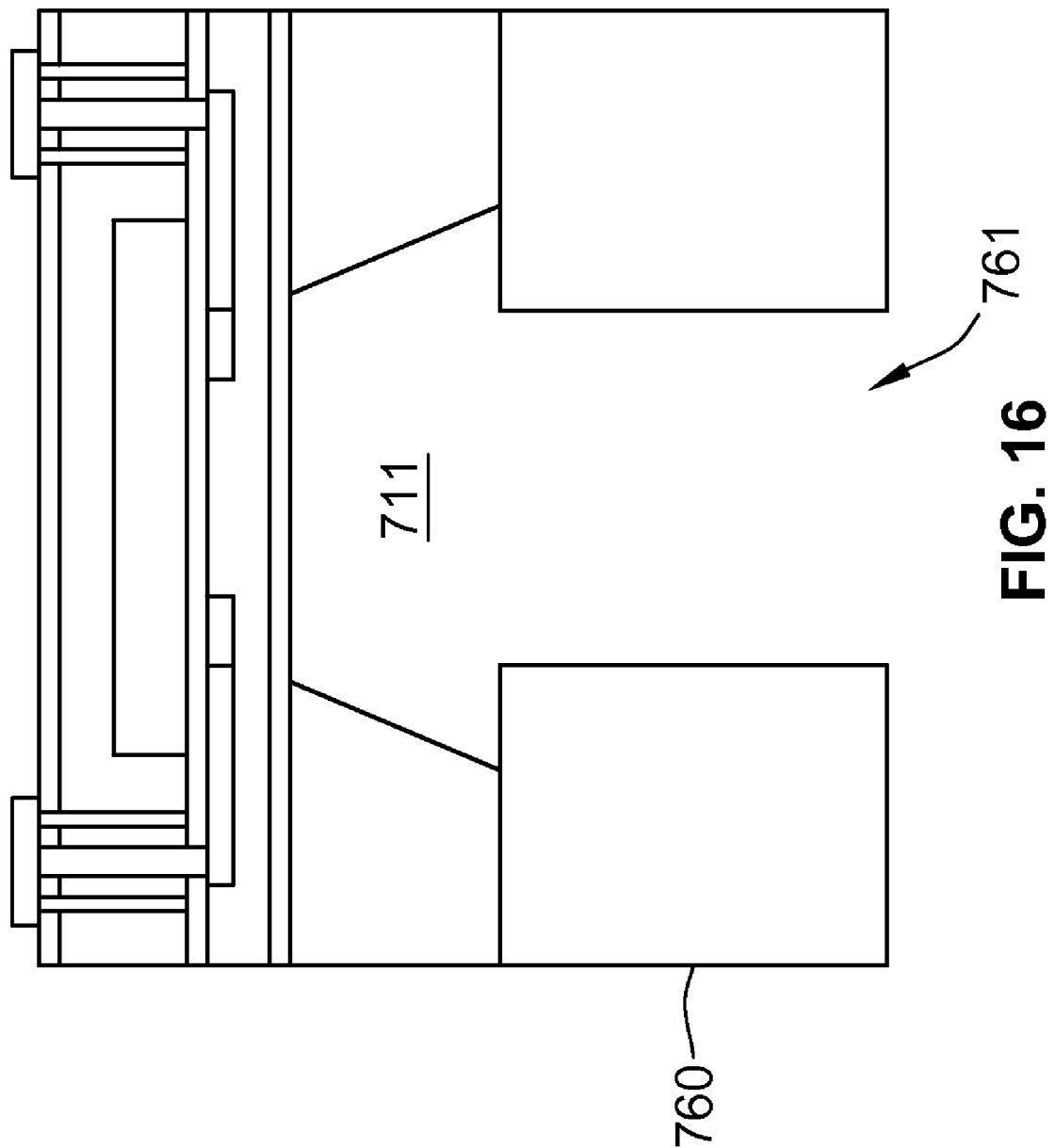

After forming the cavity 711 and the diaphragm 709, the fabrication of the sensing elements 700 shown in both FIGS. 14 and 15 are completed, and they are ready to be further assembled into a package, as described below. An optional step that can be added to meet some application requirements is to attach a pedestal substrate 760 with a hole 761 to the bottom side 718 of the device wafer 702 in such a way that the hole 761 is aligned close to the center location of the cavity 711 of the device wafer 702, as shown in FIG. 16. In a preferred embodiment, the pedestal substrate 760 is a boron silicate glass wafer, and an anodic bond is used to attach the pedestal substrate 760 to the device wafer 702. To accomplish the anodic bond, the mask layer 751 as shown in FIG. 14 needs to be removed to expose the silicon surface 718 before the anodic bond is formed. In an alternative embodiment, the pedestal substrate 760 can be either one or more silicon wafers or one or more glass wafers, and an adhesive bond using materials such as frit glass or epoxy type adhesives is used to attach it onto the bottom surface 718 of the device wafer 702. In this alternative embodiment, the mask layer 751 as shown in FIG. 14 is optional to be removed or not before the adhesive bond.

The following sections describe a packaging method using the sensing elements as described above.

Figure 17:
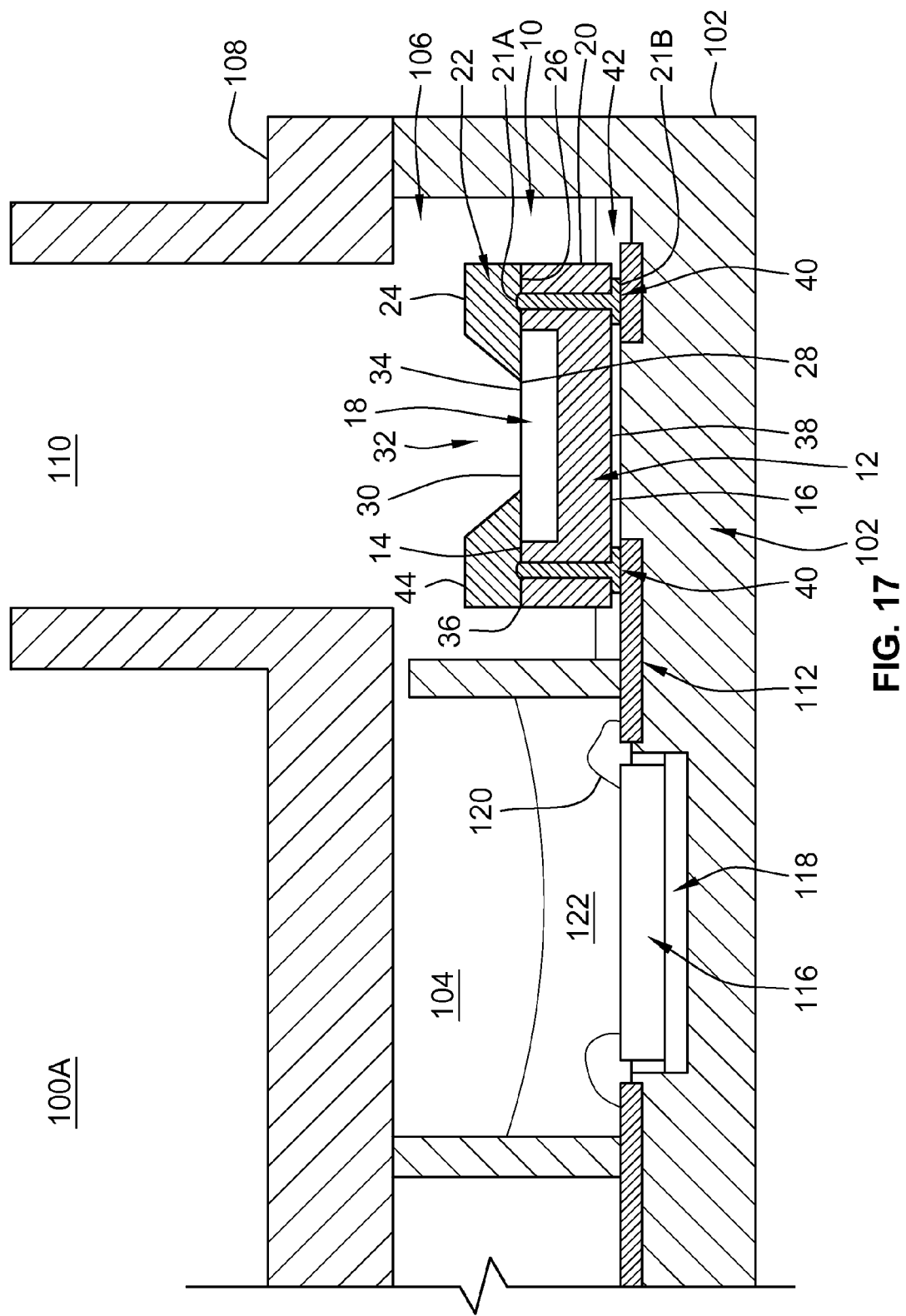
FIG. 17 is a cross-section of a packaged pressure sensor using the new sensing element that does not require gel in the second pocket.

FIG. 17 is a cross-section of a first embodiment of a pressure sensor 100A. The pressure sensor 100A is comprised of a lower housing 102 with first and second compartments or "pockets" 104 and 106. A housing cover 108 is ultrasonically welded to the lower housing 102 to hermetically seal the pockets 104 and 106 except for a fluid inlet port 110 that provides a pathway for liquids or gases into the pocket 106 to allow the fluid to exert pressure on a MEMS pressure sensing element 10A sealed into the second pocket 106 of the lower housing 102. The second pocket 106 is devoid of gel because there are no loose lead wires in the pocket 106 that require the protection provided by the gel.

An integrated circuit (IC), which is an application specific IC or ASIC, is attached to the bottom of the second pocket 104 using an adhesive 118. Lead wires 120 extend from the ASIC 116 to the lead frame 112. The lead frame 112 carries signals between the ASIC 116 and the circuit 28. The first pocket 104 of the lower housing 102 is partially filled with a gel 122 to protect the lead frame wires 120 from vibration whereas the second pocket 106 is devoid of gel. The structure shown in FIG. 17 is thus capable of being ultrasonically welded without having the high frequency sound waves damage the MEMS device as described above. Pressure changes in the port 110 are also detected more accurately by deflection of the diaphragm 30 due to the fact that there is no gel with an associated inertia caused by its mass.

Figure 18:
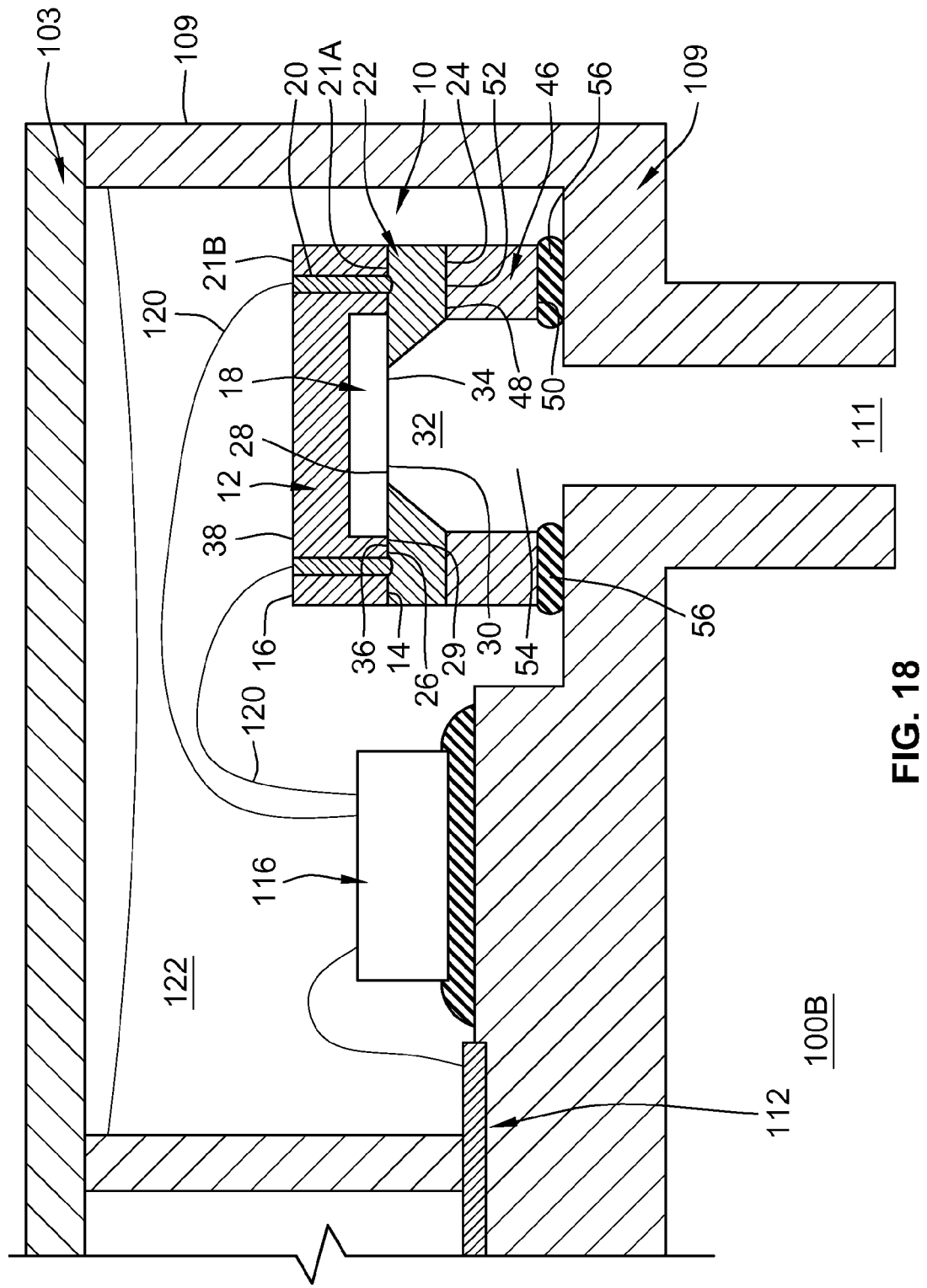
FIG. 18 is a cross-section of an alternate embodiment of a packaged pressure sensor using a new sensing element, wherein the gel may be used but will not cause any issues to the sensing element.

FIG. 18 shows an alternate embodiment of a pressure sensor 100B. In this embodiment, the sensor 100B is comprised of a housing 109 with a pocket that accommodates a MEMS pressure sensor 10B and an integrated circuit 116. As with the first embodiment, in the second embodiment the pocket is sealed by a cover 103 that is ultrasonically welded to the housing 109. Unlike the first embodiment shown in FIG. 17, which has a pressure port 110 formed into the cover 108, in the second embodiment, the pressure port 111 that allows fluid to exert pressure on the MEMS sensor 10B is formed into the housing 109. A gel 122 is added to the pocket to protect lead wires 120 that extend from the bottom surface 38 of the silicon element 20 to an integrated circuit 116. Since the gel 122 is added to the side of the MEMS sensor 10B away from the pressure port 111, the gel 122 does not affect the responsiveness of the diaphragm 30 nor does ultrasonic welding the cover 103 to the housing 109 tend to damage the MEMS sensor 10B.

The MEMS device 10B is attached to a glass or silicon pedestal 46 having a top surface 48 and a bottom surface 50. An anodic bonding, or adhesive bonding, or fusion bonding 52 between the top of the pedestal 48 and the top surface 24 of the die 22 permanently joins the pedestal 46 and the MEMS pressure sensor 10B to each other. A thru-hole 54 is formed in the pedestal 46 by drilling or etching, etc. An adhesive 56 between the bottom surface 50 of the pedestal 46 and the housing 109 provides a sealed pathway for fluids that pass through the port 111 in the housing 109 and exert pressure on the diaphragm 30. Pressure exerted on the diaphragm 30 causes the piezoresistive devices in the circuit 28 to change their resistance, the changes of which are amplified and calibrated by the electronics in a nearby ASIC 116 that is connected to the piezoresistive device via lead wires 120. In FIG. 18, the MEMS pressure sensor 10B detects absolute pressure inside the port 111.

In each embodiment, the bottom surface 16 of the silicon cap 12 is provided with a dielectric layer (not visible) and a metal bond pad which is connected to the nearby second end 21B of the conductive vias 20 through a contact window or opening in the dielectric layer, not shown in the figures. Also not shown in the figures due to its small size is a conductive interconnect on the bottom surface 26 of the die 22 and which provides an electrical connection between the first end 21A of the conductive via 20 and the transducer 28 formed into the surface of the diaphragm 30. A complete circuit or signal pathway therefore exists between the piezoresistive transducer 28 formed on the diaphragm 20 and an ASIC 116 via the conductive vias, bond pads 40, and the lead frames 112 and lead wires 120.

With regard to FIG. 17 and FIG. 18, the metal bond pad 40 is preferably embodied as a ball grid array or BGA. The metallic interconnects between the first end 21A of the vias 20 is preferably an electrically conductive adhesive or solder.

The foregoing description is for purposes of illustration. The true scope of the invention is defined by the appurtenant claims.

What is claimed is:
1. A pressure sensor element, comprising:
a silicon cap having first and second sides, the first side including a recess extending into the cap, and the cap further having at least one insulated conductive via residing outside of the recess;
a silicon die having first and second sides, the first side including a circuit, electrical interconnects, and a silicon diaphragm, the second side having a cavity extending into the die with the bottom surface being the bottom surface of the silicon diaphragm; and a bonding layer attaching the first side of the silicon die to the first side of the silicon cap;

wherein the recess of the cap encapsulating the top surface of the diaphragm on the die, and the at least one conductive via in the cap electrically connecting with at least one of the electrical interconnects.

2. The pressure sensor element of claim 1, wherein the bonding layer between the first side of the cap and the first side of the silicon die is silicon oxide.

3. The pressure sensor element of claim 1, wherein the at least one conductive via has a first end and second end and the conductive via is comprised of at least one of:

metal; and doped poly crystalline silicon.

4. The pressure sensor element of claim 1, wherein the second side of the cap includes a dielectric layer and at least one metal bond pad on top of the dielectric layer connecting to the at least one conductive via by a metal interconnect through a contact window in the dielectric layer.

5. The pressure sensor element of claim 1, wherein the at least one conductive via is within a cylindrically-shaped silicon island and the silicon island is isolated from the rest of the silicon cap by an annulus shaped dielectric material surrounding the cylindrically-shaped silicon island.

6. The pressure sensor element of claim 1, wherein the recess is at least partially evacuated.

7. The pressure sensor element of claim 1, wherein the recess has a through cap hole.

8. The pressure sensor element of claim 1, further comprising a passivation layer over at least a portion of the first side of the silicon die including the silicon diaphragm.

9. The pressure sensor element of claim 1, further comprising a pedestal having top and bottom surfaces and a through hole between the top and bottom surfaces.

10. The pressure sensor element of claim 9, wherein the pedestal is silicon.

11. The pressure sensor element of claim 10, further comprising a fusion bond between the second side of the silicon die and the top surface of the pedestal, and the hole of the pedestal at least partially overlapping with the cavity of the silicon die.

12. The pressure sensor element of claim 10, further comprising an adhesive bond between the second side of the silicon die and the top surface of the pedestal and the hole of the pedestal substrate at least partially overlapping with the cavity of the silicon die.

13. The pressure sensor element of claim 9, wherein the pedestal is borosilicate glass.

14. The pressure sensor element of claim 13, further comprising an anodic bond between the second side of the silicon die and the top surface of the pedestal, and the hole of the pedestal at least partially overlaps the cavity of the silicon die.

15. The pressure sensor element of claim 1, wherein the recess on the silicon cap has a depth greater than the deflection of the diaphragm.

16. The pressure sensor element of claim 13, further comprising an adhesive bond between the second side of the silicon die and the top surface of the pedestal, and the hole of the pedestal substrate at least partially overlapping with the cavity of the silicon die.

17. A pressure sensor comprised of:

a cover with a port;

a housing including first and second pockets, and at least one lead frame extending between the first and second pockets;

a pressure sensor element in the second pocket;

a metallic connector electrically connecting at least one lead frame with one metal bond pad of the pressure sensor element;

at least one integrated circuit (IC) in the first pocket, electrically connected to the pressure sensing element via wires, lead frame and metallic connector; and a gel partially filling the first pocket to cover the circuit and wire bonds.

18. The pressure sensor of claim 17, the pressure sensor element further comprising:

a silicon cap having first and second sides, the first side including a recess extending into the cap, and the cap further having at least one insulated conductive via residing outside of the recess;

a silicon die having first and second sides, the first side including a circuit, electrical interconnects, and a silicon diaphragm, the second side having a cavity extending into the die with the bottom surface being the bottom surface of the silicon diaphragm; and a bonding layer attaching the first side of the silicon die to the first side of the silicon cap;

wherein the recess of the cap encapsulating the top surface of the diaphragm on the die, and the at least one conductive via in the cap electrically connecting with at least one of the electrical interconnects.

19. The pressure sensor of claim 17, wherein the metallic connector is an adhesive.

20. The pressure sensor of claim 17, wherein an under-fill material covers the metallic connector.

21. A pressure sensor comprised of:

a cover;

a housing with a port and lead frame, and the housing having top and bottom sides;

a pressure sensor element mounted in the housing using adhesive material;

at least one integrated circuit (IC), electrically connected to the pressure sensing element via wires;

a gel partially filling the housing to cover IC, pressure sensor element and wires; and the sensor element including:

a silicon cap having first and second sides, the first side including a recess extending into the cap, and the cap further having at least one insulated conductive via residing outside of the recess;

a silicon die having first and second sides, the first side including a circuit, electrical interconnects, and a silicon diaphragm, the second side having a cavity extending into the die with the bottom surface being the bottom surface of the silicon diaphragm;

a bonding layer attaching the first side of the silicon die to the first side of the silicon cap;

the recess of the cap encapsulating the top surface of the diaphragm on the die, and the at least one conductive via in the cap electrically connecting with at least one of the electrical interconnects.

22. The pressure sensor of claim 21, wherein the port is located at the bottom side of the housing.

23. The pressure sensor of claim 22, wherein the port is at least partially overlapped with the cavity of the pressure sensor element.

* * * * *